United States Patent
Wang

(10) Patent No.: US 9,269,405 B1
(45) Date of Patent: Feb. 23, 2016

(54) SWITCHABLE BIT-LINE PAIR SEMICONDUCTOR MEMORY

(71) Applicant: MEDIATEK INC., Hsin-Chu (TW)

(72) Inventor: Chia-Wei Wang, Taichung (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/533,065

(22) Filed: Nov. 4, 2014

(51) Int. Cl.
*G11C 17/00* (2006.01)
*G11C 5/06* (2006.01)
*G11C 7/06* (2006.01)

(52) U.S. Cl.
CPC . *G11C 5/06* (2013.01); *G11C 7/062* (2013.01)

(58) Field of Classification Search
USPC ............................................ 365/94, 103, 104
See application file for complete search history.

(56) References Cited

U.S. PATENT DOCUMENTS

| | | | | |
|---|---|---|---|---|
| 4,021,781 A * | 5/1977 | Caudel | ................... | G11C 17/12 365/104 |
| 5,117,389 A * | 5/1992 | Yiu | ....................... | H01L 27/112 365/104 |
| 5,323,342 A * | 6/1994 | Wada | .................... | G11C 17/126 365/104 |
| 5,790,450 A * | 8/1998 | Nishizaka | ............ | G11C 17/126 365/104 |
| 5,835,398 A * | 11/1998 | Hirose | .................... | G11C 17/12 365/104 |
| 5,852,570 A * | 12/1998 | Hotta | .................... | H01L 27/112 365/104 |
| 7,355,876 B2 * | 4/2008 | Murata | .................... | G11C 7/02 365/104 |
| 7,649,762 B1 * | 1/2010 | Lin | ...................... | H01L 27/0207 365/104 |
| 7,940,546 B2 * | 5/2011 | Thyagarajan | ............ | G11C 7/12 365/104 |
| 8,570,784 B2 * | 10/2013 | Liu | ........................ | G11C 7/06 365/104 |

* cited by examiner

*Primary Examiner* — Trong Phan
(74) *Attorney, Agent, or Firm* — Winston Hsu; Scott Margo

(57) ABSTRACT

A semiconductor memory includes: a first switching transistor, wherein the first switching transistor has a first terminal, a second terminal, and a third terminal, and the second terminal is coupled to a first word-line; a first differential bit-line pair possessing a non-inverted bit-line and an inverted bit-line, wherein the non-inverted bit-line and the inverted bit-line thereof are mutually-exclusively coupled to the first terminal of the first switching transistor for storing first information; and a second differential bit-line pair possessing a non-inverted bit-line and an inverted bit-line, wherein the non-inverted bit-line and the inverted bit-line thereof are mutually-exclusively coupled to the third terminal of the first switching transistor for storing second information.

19 Claims, 6 Drawing Sheets

SWITCHABLE BIT-LINE PAIR SEMICONDUCTOR MEMORY

BACKGROUND

The present invention relates generally to semiconductor memories, and more particularly, to a switchable bit-line pair Via ROM (Via-programmable Read-Only Memory) that has no dummy poly gate and has a high sensing speed.

Conventional Via ROMs require dummy poly gates for diffusion isolation as shown in FIG. 1, which is a circuit diagram illustrating a 4×4 Via ROM of the prior art. Each transistor has a first terminal connected to a reference voltage (e.g. a ground voltage) and a second terminal connected to one of four word-lines. Most importantly, each transistor has a third terminal for storing data according to whether the terminal is connected to one of four bit-lines through a Via contact. Bit-lines 0-3 are represented as "BL0-BL3", and word-lines 0-3 are represented as "WL0-WL3". FIG. 2 illustrates a layout of the 4×4 Via ROM shown in FIG. 1. The effective bit-cell size needs to be 1.5 poly-pitch on average as a result of the extra dummy poly gates. In addition, sensing speed and device local variations of the conventional Via ROMs need to be strengthened to comply with the trend of high speed ROMs.

SUMMARY

One of the objectives of the present invention is to provide a switchable bit-line pair Via ROM without dummy poly gates and with a high sensing speed for improving the above issues.

According to an aspect of the present invention, a semiconductor memory is disclosed. The semiconductor memory comprises: a first switching transistor, wherein the first switching transistor has a first terminal, a second terminal, and a third terminal, and the second terminal is coupled to a first word-line; a first differential bit-line pair possessing a non-inverted bit-line and an inverted bit-line, wherein the non-inverted bit-line and the inverted bit-line thereof are mutually-exclusively coupled to the first terminal of the first switching transistor for storing first information; and a second differential bit-line pair possessing a non-inverted bit-line and an inverted bit-line, wherein the non-inverted bit-line and the inverted bit-line thereof are mutually-exclusively coupled to the third terminal of the first switching transistor for storing second information.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
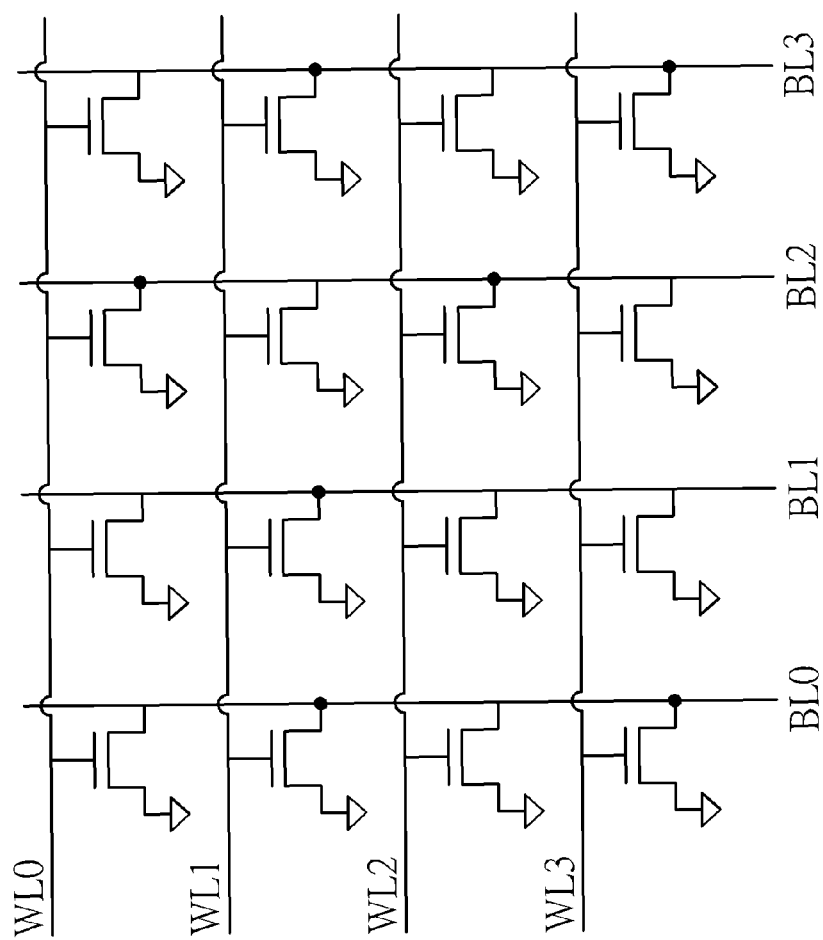
FIG. 1 is a circuit diagram illustrating a 4×4 Via ROM of the prior art.
Figure 2:
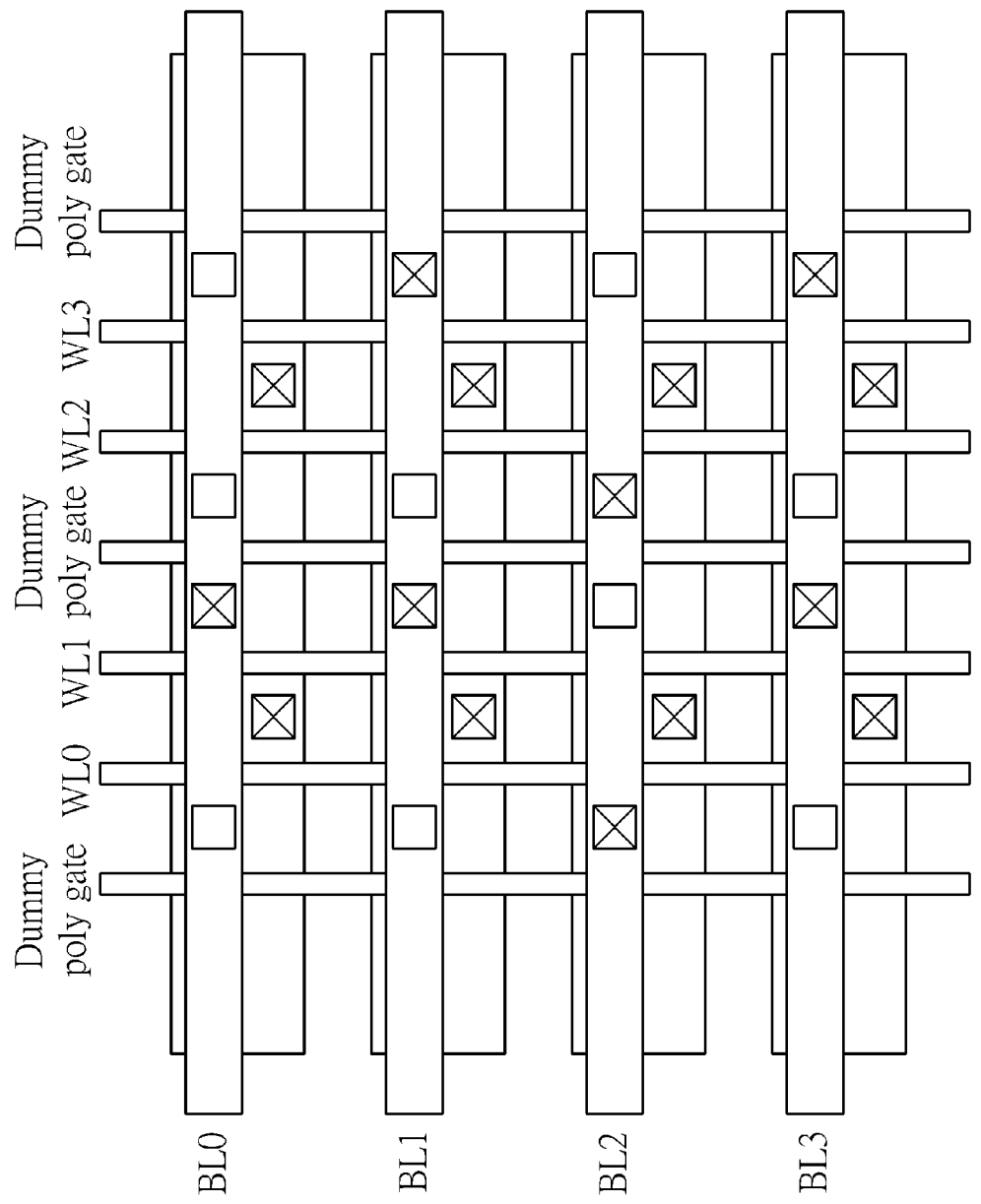
FIG. 2 illustrates a layout of the 4×4 Via ROM shown in FIG. 1.
Figure 3:
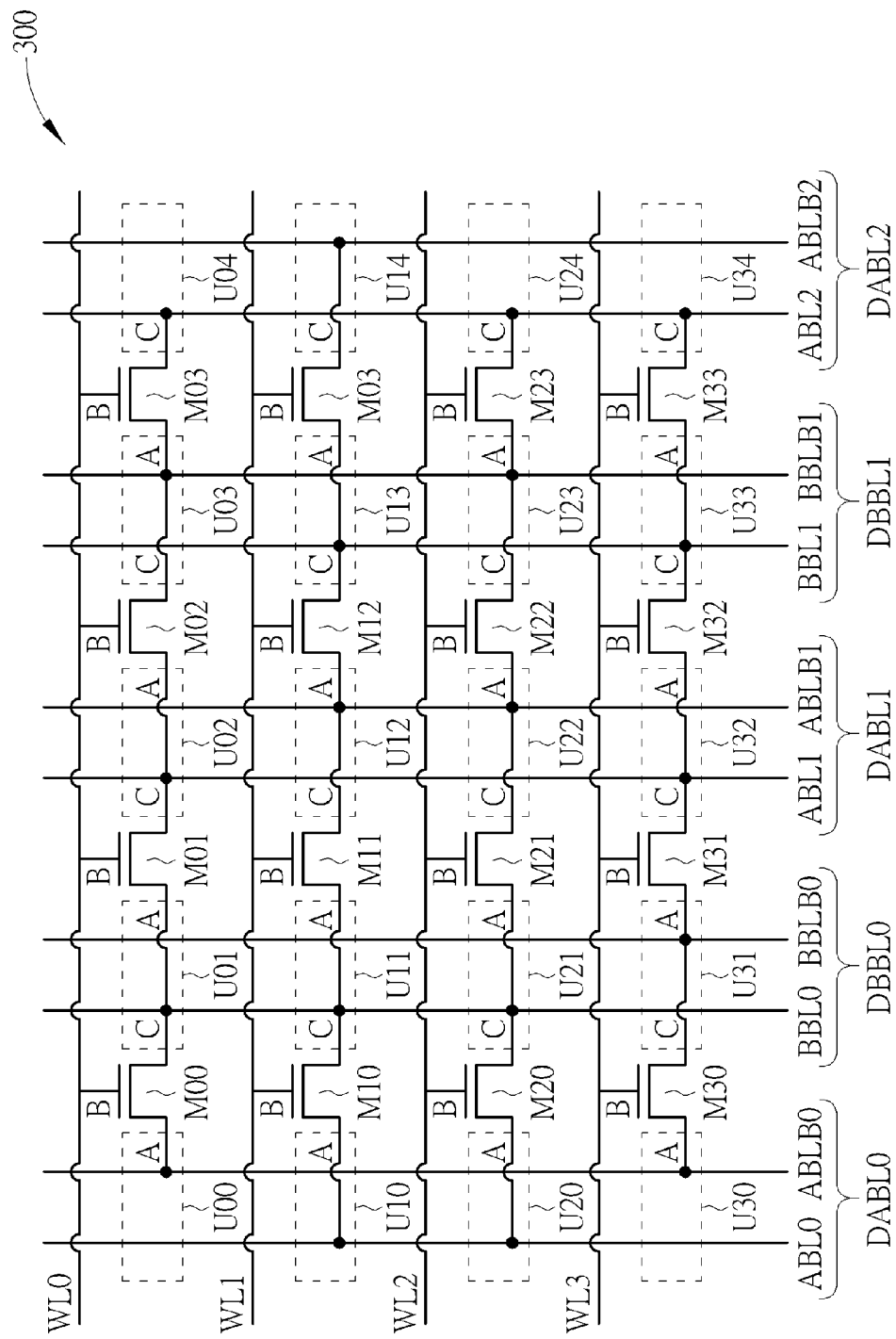
FIG. 3 is a circuit diagram illustrating a semiconductor memory 300 according to a first embodiment of the present invention.

FIG. 3 is a circuit diagram illustrating a semiconductor memory 300 according to a first embodiment of the present invention. The semiconductor memory 300 possesses 5 memory units for each row, i.e. 20 memory units in total, wherein memory units U00-U04 are for the first row (controlled by a word-line WL0); memory units U10-U14 are for the second row (controlled by a word-line WL1); memory units are U20-U24 for the third row (controlled by a word-line WL2); and memory units U30-U34 are for the fourth row (controlled by a word-line WL3). The semiconductor memory 300 includes 16 switching transistors M00-M33 which could be any transistor having a switching function known in the field, such as P-channel MOSFETs (metal-oxide-semiconductor field-effect transistor) or N-channel MOSFETs. The switching transistors M00, M01, M02, M03 each has a first terminal A (a drain/source terminal), a second terminal B (a gate terminal), and a third terminal C (a drain/source terminal), wherein the second terminals B are coupled to the word-line WL0; the switching transistors M10, M11, M12, M13 each have a first terminal A (a drain/source terminal), a second terminal B (a gate terminal), and a third terminal C (a drain/source terminal), wherein the second terminals B are coupled to the word-line WL1; the switching transistors M20, M21, M22, M23 each have a first terminal A (a drain/source terminal), a second terminal B (a gate terminal), and a third terminal C (a drain/source terminal), wherein the second terminals B are coupled to the word-line WL2; and the switching transistors M30, M31, M32, M33 each have a first terminal A (a drain/source terminal), a second terminal B (a gate terminal), and a third terminal C (a drain/source terminal), and the second terminals B are coupled to the word-line WL3.

The semiconductor memory 300 possesses a first differential bit-line pair DABL0, a second differential bit-line pair DBBL0, a third differential bit-line pair DABL1, a fourth differential bit-line pair DBBL1 and a fifth differential bit-line pair DABL2. The first differential bit-line pair DABL0 possesses a first non-inverted bit-line ABL0 and a first inverted bit-line ABLB0. The first non-inverted bit-line ABL0 and the first inverted bit-line ABLB0 are mutually-exclusively coupled to each of the first terminals A of the switching transistors M00, M10, M20, M30 to form the memory units U00, U10, U20 and U30, respectively, for storing information. The second differential bit-line pair DBBL0 possesses a second non-inverted bit-line BBL0 and a second inverted bit-line BBLB0. The second non-inverted bit-line BBL0 and the second inverted bit-line BBLB0 are mutually-exclusively coupled to each of the third terminals C of the switching transistors M00, M10, M20, M30 (i.e. the first terminals A of the switching transistors M01, M11, M21, M31) to form the memory units U01, U11, U21 and U31, respectively, for storing information.

The third differential bit-line pair DABL1 possesses a third non-inverted bit-line ABL1 and a third inverted bit-line ABLB1. The third non-inverted bit-line ABL1 and the third inverted bit-line ABLB1 are mutually-exclusively coupled to each of the third terminals C of the switching transistors M01, M11, M21, M31 (i.e. the first terminals A of the switching transistors M02, M12, M22, M32) to form the memory units U02, U12, U22 and U32, respectively, for storing information. The fourth differential bit-line pair DBBL1 possesses a fourth non-inverted bit-line BBL1 and a fourth inverted bit-line BBLB1. The fourth non-inverted bit-line BBL1 and the fourth inverted bit-line BBLB1 are mutually-exclusively coupled to each of the third terminals C of the switching transistors M02, M12, M22, M32 (i.e. the first terminals A of the switching transistors M03, M13, M23, M33) to form the memory units U03, U13, U23 and U33, respectively, for storing information. The fifth differential bit-line pair DABL2 possesses a fifth non-inverted bit-line ABL2 and a fifth inverted bit-line ABLB2. The fifth non-inverted bit-line ABL2 and the fifth inverted bit-line ABLB2 are mutually-exclusively coupled to each of the third terminals C of the switching transistors M03, M13, M23, M33 to form the memory units U04, U14, U24 and U34, respectively, for storing information.

As shown in FIG. 3, the first terminal of the switching transistor M00 is contact-connected (e.g. by using a Via contact) to the inverted bit-line ABLB0, and the third terminal of the switching transistor M00 and the first terminal of the switching transistor M01 are contact-connected (e.g. by using a Via contact) to the second non-inverted bit-line BBL0. When the information stored in the memory unit U00 is to be read, the switching transistor M00 will be turned on by asserting the word-line WL0. Specifically, the word-line WL0 will be switched to a first reference voltage (e.g. a supply voltage VDD for the scenario of adopting an N-channel MOSFET as the switching transistor M00, or a ground voltage GND for the scenario of adopting a P-channel MOSFET as the switching transistor M00). The second non-inverted bit-line BBL0 and the second inverted bit-line BBLB0 will be switched to a second reference voltage (e.g. a ground voltage GND for the scenario of adopting an N-channel MOSFET as the switching transistor M00, or a supply voltage VDD for the scenario of adopting a P-channel MOSFET as the switching transistor M00). Then, a sense amplifier will be utilized to read out the information stored in the memory unit U00 of the switching transistor M00 by sensing the voltage level of the first non-inverted bit-line ABL0 of the first differential bit-line pair DABL0 in a non-inverted fashion and the voltage level of the first inverted bit-line ABLB0 of the first differential bit-line pair DABL0 in an inverted fashion, wherein the sense amplifier is configured as a differential amplifier and is coupled to the first differential bit-line pair DABL0.

Figure 4:
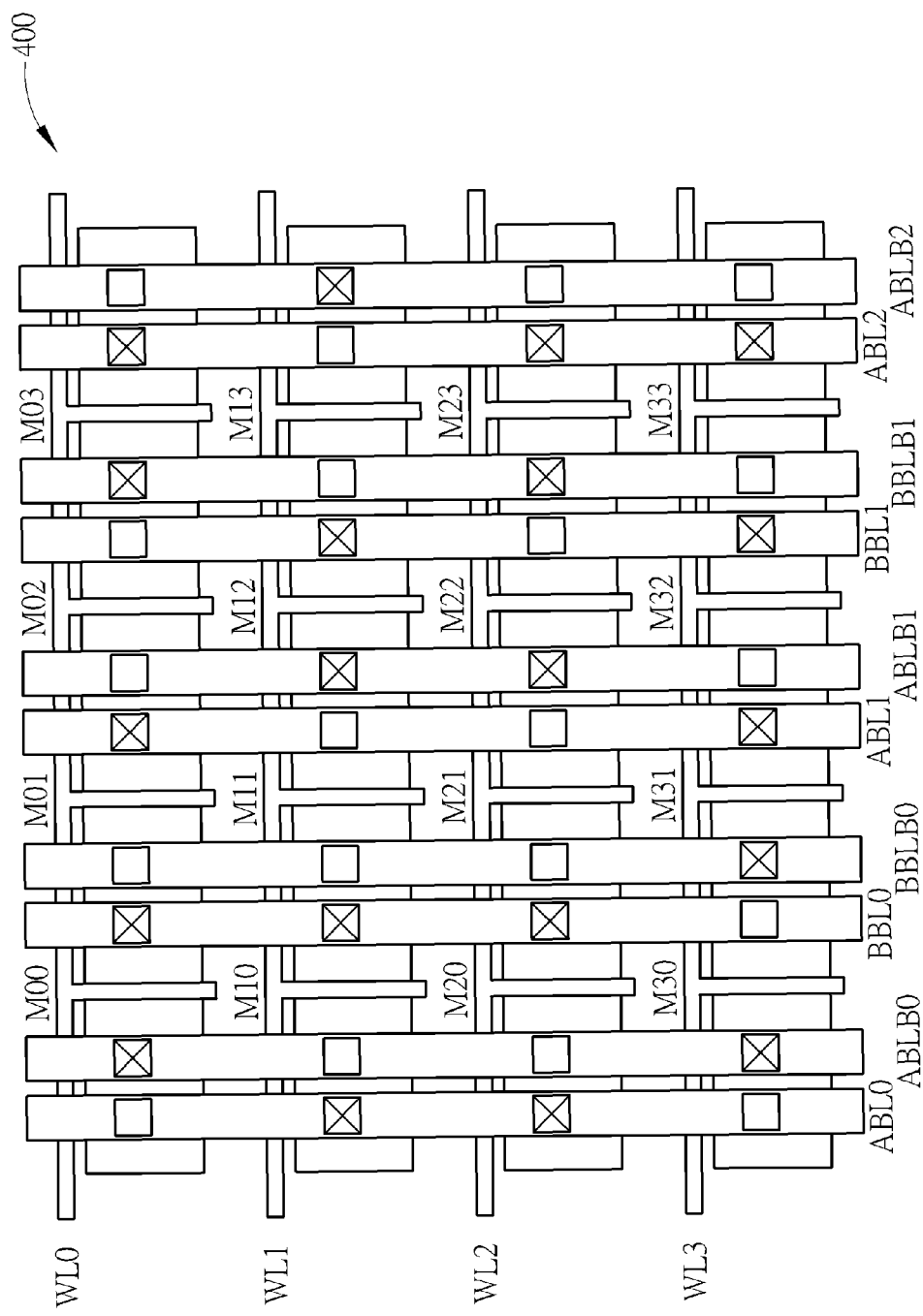
FIG. 4 illustrates a layout of the semiconductor memory 300 shown in FIG. 3.

FIG. 4 is a layout diagram of the semiconductor memory 300 shown in FIG. 3. From FIG. 4, it is clear that each two adjacent switching transistors have a common doping region between the two poly gates (the second terminals of the two adjacent switching transistors), for instance, the doping region between the switching transistors M11 and M12 may be a drain terminal of the switching transistor M11 and also a source terminal of the switching transistor M12. As a result, the circuit in this embodiment can be operated at a higher speed compared to the conventional circuit by switching two differential bit-line pairs adjacent to the memory unit which is to be read at the second voltage. For example, when the information stored in the memory unit U01 is to be read, both the switching transistor M00 and the switching transistor M01 will be turned on by asserting the word-line WL0 which is coupled to the second (gate) terminals of the switching transistors M00 and M01. The first non-inverted bit-line ABL0 and the first inverted bit-line ABLB0 will be switched to the second reference voltage, and the third non-inverted bit-line ABL1 and the third inverted bit-line ABLB1 will also be switched to the second reference voltage. In a case where the switching transistors M00 and M01 are N-channel MOSFETs, the voltage level of the second non-inverted bit-line BBL0 can be drawn to the ground voltage through two paths, i.e. a first path from the third terminal C of the switching transistor M00 to the first inverted bit-line ABLB0 via the first terminal A of the switching transistor M00; and a second path from the first terminal A of the switching transistor M01 to the third non-inverted bit-line ABL1 via the third terminal C of the switching transistor M01. As the leakage path is twice as much as in the conventional art, the discharge of the voltage level of the second non-inverted bit-line BBL0 will be faster. Then, a sense amplifier coupled to the second differential bit-line pair DBBL0 will be utilized to read out the information stored in the memory unit U01 between the switching transistor M00 and the switching transistor M01 by sensing the voltage level of the second non-inverted bit-line BBL0 of the second differential bit-line pair DBBL0 in a non-inverted fashion, e.g. the ground voltage will be interpreted as a bit value of zero is stored; and the voltage level of the second inverted bit-line BBLB0 of the second differential bit-line pair DBBL0 in an inverted fashion, e.g. the supply voltage will be interpreted as a bit value of zero is stored.

When the information stored in the memory unit U02 is to be read, the second differential bit-line pair DBBL0 and the fourth differential bit-line pair DBBL1 will be switched to the second reference voltage. In this way, the voltage level of the third non-inverted bit-line ABL1 can be drawn to the second reference voltage through two paths, i.e. a path passing through the switching transistor M01 and the second non-inverted bit-line BBL0, and a path passing through the switching transistor M02 and the fourth inverted bit-line BBLB1. As can be seen from FIG. 3 and FIG. 4, each bit-line pair may be switched to the second voltage level or sensed by the corresponding sense amplifier; hence, this embodiment includes no dummy polys and the effective bit-cell size is to be 1 poly-pitch on average. Moreover, the differential sensing contributes a yield rate. Regarding the layout, in other embodiments, the bit-lines may be in different metallization planes for saving on chip area, e.g. the inverted bit lines lie in a metallization plane, and the non-inverted bit lines lie in another metallization plane.

Figure 5:
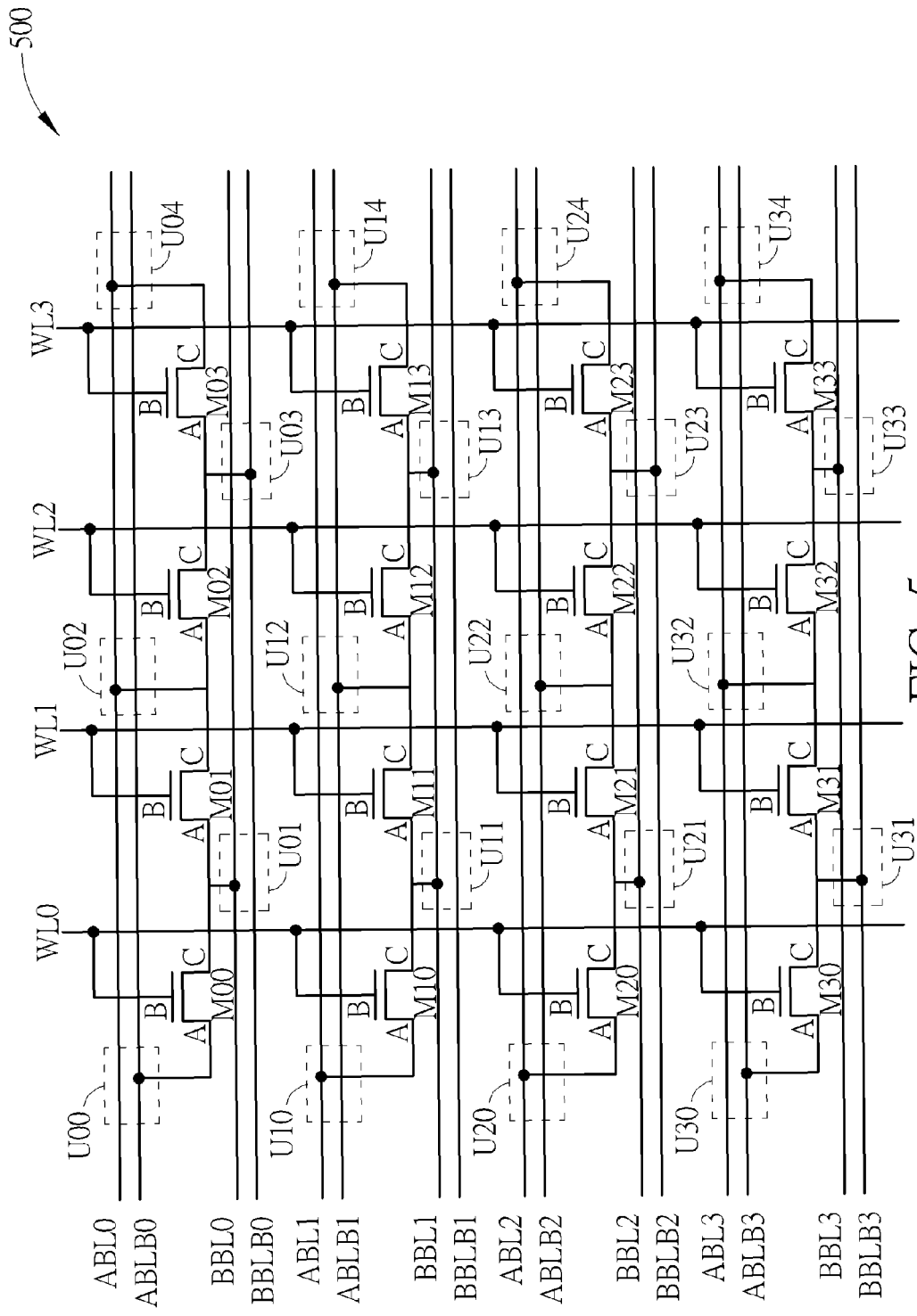
FIG. 5 is a circuit diagram illustrating a semiconductor memory 500 according to a second embodiment of the present invention.
Figure 6:
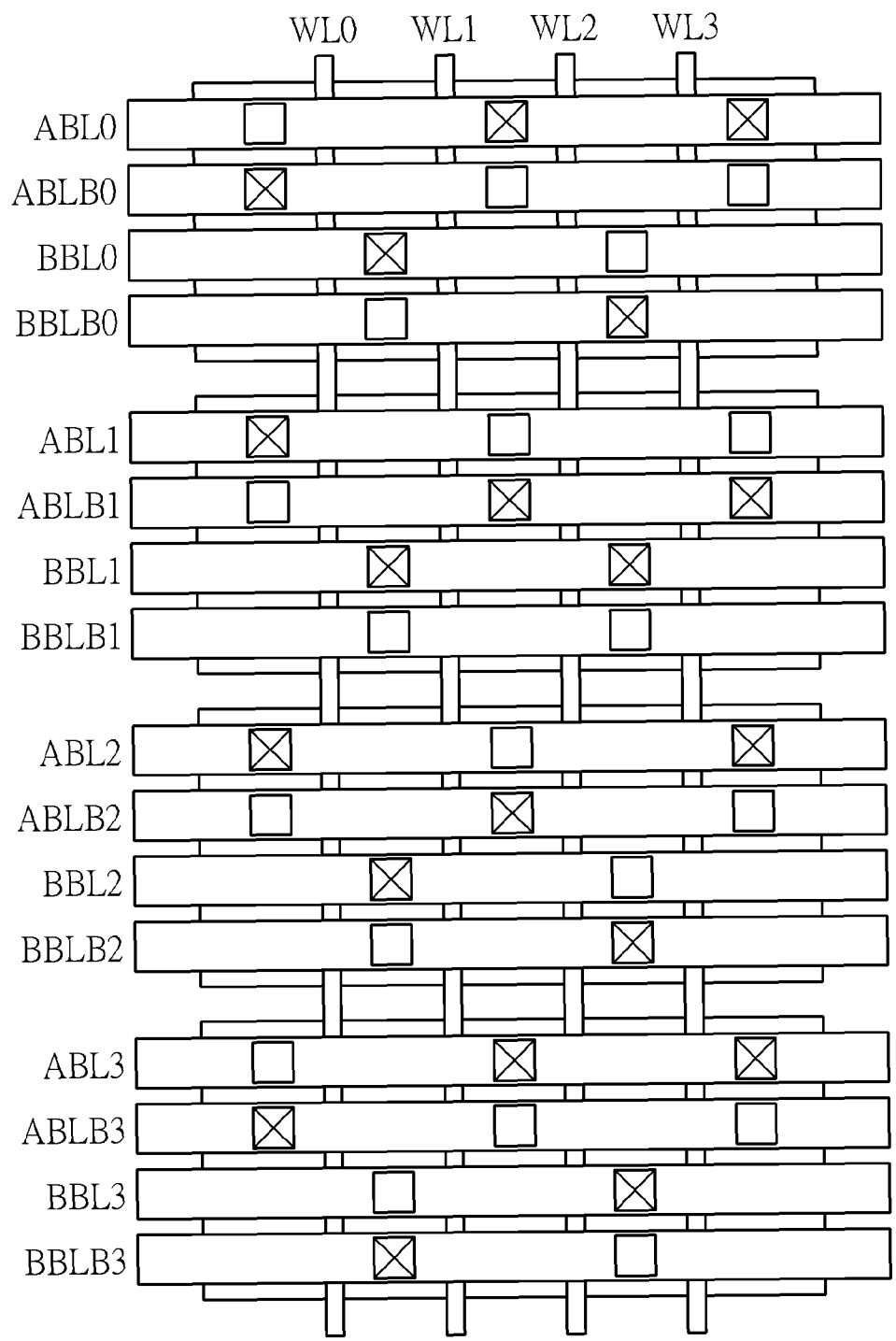
FIG. 6 illustrates a layout of the semiconductor memory 500 shown in FIG. 5.

FIG. 5 is a circuit diagram illustrating a semiconductor memory 500 according to a second embodiment of the present invention. The semiconductor memory 500 is a schematic of an alternative design of the semiconductor memory 300, while content stored in each memory unit of the semiconductor memory 500 is the same as in the semiconductor memory 300. The word-lines WL0-WL3 control the switching transistors in each column, while the differential bit-lines are in rows. FIG. 6 illustrates a layout of the semiconductor memory 500 shown in FIG. 5. Those persons skilled in the art should readily understand the operation of the semiconductor memory 500 after reading the above description regarding the operations of the semiconductor memory 300. Some extra details should be noted. For instance, when the memory unit U32 is to be read, both the word-lines WL1 and WL2 need to be asserted since the two adjacent switching transistors M31 and M32 belong to different word-lines now. Only one differential bit-line pair is required to be pulled to second voltage, however, according to FIG. 5.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory, comprising:
   a first switching transistor, wherein the first switching transistor has a first terminal, a second terminal, and a third terminal, and the second terminal is coupled to a first word-line;
   a first differential bit-line pair possessing a non-inverted bit-line and an inverted bit-line, wherein the non-inverted bit-line and the inverted bit-line are mutually-exclusively coupled to the first terminal of the first switching transistor for storing first information; and
   a second differential bit-line pair possessing a non-inverted bit-line and an inverted bit-line, wherein the non-inverted bit-line and the inverted bit-line are mutually-exclusively coupled to the third terminal of the first switching transistor for storing second information.

2. The semiconductor memory of claim 1, wherein when the first information is to be read, the first switching transistor is turned on by coupling the first word-line to a first reference voltage, the second differential bit-line pair is coupled to a second reference voltage, and the first information is read from the non-inverted bit-line of the first differential bit-line pair in a non-inverted fashion and read from the inverted bit-line of the first differential bit-line pair in an inverted fashion.

3. The semiconductor memory of claim 1, further comprising:
   a second switching transistor, wherein the second switching transistor possesses a first terminal, a second terminal, and a third terminal, the second terminal of the second switching transistor is coupled to the first word-line and the third terminal of the first switching transistor and the first terminal of the second switching transistor have a common doping region; and
   a third differential bit-line pair possessing a non-inverted bit-line and an inverted bit-line, wherein the non-inverted bit-line and the inverted bit-line are mutually-exclusively coupled to the third terminal of the second switching transistor for storing third information.

4. The semiconductor memory of claim 3, wherein when the second information directed to the common doping region is to be read, the first switching transistor and the second switching transistor are both turned on by coupling the first word-line to a first reference voltage, and the first differential bit-line pair coupled to the first terminal of the first switching transistor and the third differential bit-line pair coupled to the third terminal of the second switching transistor are respectively coupled to a second reference voltage different from the first reference voltage.

5. The semiconductor memory of claim 2, wherein the first reference voltage and the second reference voltage have a voltage drop therebetween.

6. The semiconductor memory of claim 2, wherein the first switching transistor is an N-channel metal-oxide-semiconductor field-effect transistor (MOSFET).

7. The semiconductor memory of claim 6, wherein the first reference voltage is a supply voltage and the second reference voltage is a ground voltage.

8. The semiconductor memory of claim 2, wherein the first switching transistor is a P-channel metal-oxide-semiconductor field-effect transistor (MOSFET).

9. The semiconductor memory of claim 8, wherein the first reference voltage is a ground voltage and the second reference voltage is a supply voltage.

10. The semiconductor memory of claim 1, wherein the first terminal of the first switching transistor is contact-connected to one of the non-inverted bit-line and the inverted bit-line of the first differential bit-line pair, and the third terminal of the first switching transistor is contact-connected to one of the non-inverted bit-line and the inverted bit-line of the second differential bit-line pair.

11. The semiconductor memory of claim 1, further comprising:
    a first sense amplifier configured as a differential amplifier, coupled to the first differential bit-line pair; and
    a second sense amplifier configured as a differential amplifier, coupled to the second differential bit-line pair.

12. The semiconductor memory of claim 1, comprising a plurality of metallization planes, wherein the two inverted bit lines and the two non-inverted bit lines do not lie in a same metallization plane.

13. The semiconductor memory of claim 1, further comprising:
    a second switching transistor, wherein the second switching transistor possesses a first terminal, a second terminal, and a third terminal, the second terminal of the second switching transistor is coupled to a second word-line, the third terminal of the first switching transistor and the first terminal of the second switching transistor have a common doping region, and the third terminal of the third switching transistor is coupled to the first differential bit-line pair.

14. The semiconductor memory of claim 13, wherein when the second information directed to the common doping region is to be read, the first switching transistor and the second switching transistor are both turned on by respectively coupling the first word-line and the second word-line to a first reference voltage, and the first differential bit-line pair coupled to the first terminal of the first switching transistor and the third terminal of the third switching transistor is coupled to a second reference voltage.

15. The semiconductor memory of claim 14, wherein the first reference voltage and the second reference voltage have a voltage drop therebetween.

16. The semiconductor memory of claim 14, wherein the first switching transistor is an N-channel metal-oxide-semiconductor field-effect transistor (MOSFET).

17. The semiconductor memory of claim 16, wherein the first reference voltage is a supply voltage and the second reference voltage is a ground voltage.

18. The semiconductor memory of claim 14, wherein the first switching transistor is a P-channel metal-oxide-semiconductor field-effect transistor (MOSFET).

19. The semiconductor memory of claim 18, wherein the first reference voltage is a ground voltage and the second reference voltage is a supply voltage.

* * * * *